United States Patent
Pan et al.

(10) Patent No.: US 9,315,267 B2
(45) Date of Patent: Apr. 19, 2016

(54) INTEGRATION OF HIGH-EFFICIENCY, LIGHTWEIGHT SOLAR SHEETS ONTO UNMANNED AERIAL VEHICLE FOR INCREASED ENDURANCE

(71) Applicant: MICROLINK DEVICES, INC., Niles, IL (US)

(72) Inventors: Noren Pan, Wilmette, IL (US); Raymond Chan, Hoffman Estates, IL (US); Haruki Miyamoto, Arlington Heights, IL (US); Andree Wibowo, Des Plaines, IL (US); Mark Osowski, Vernon Hills, IL (US); Christopher Youtsey, Libertyville, IL (US); David McCallum, West Chicago, IL (US)

(73) Assignee: MICROLINK DEVICES, INC., Niles, IL (US)

( * ) Notice: Subject to any disclaimer, the term of this patent is extended or adjusted under 35 U.S.C. 154(b) by 517 days.

(21) Appl. No.: 13/769,223

(22) Filed: Feb. 15, 2013

(65) Prior Publication Data

US 2013/0285440 A1    Oct. 31, 2013

Related U.S. Application Data

(60) Provisional application No. 61/599,390, filed on Feb. 15, 2012.

(51) Int. Cl.
*B64C 39/02* (2006.01)
*B60L 8/00* (2006.01)
*H02S 10/00* (2014.01)

(52) U.S. Cl.
CPC .............. *B64C 39/024* (2013.01); *B60L 8/003* (2013.01); *B60L 2200/10* (2013.01); *B64C 2201/021* (2013.01); *B64C 2201/042* (2013.01); *B64D 2211/00* (2013.01); *B64D 2221/00* (2013.01); *Y02T 10/7083* (2013.01)

(58) Field of Classification Search
CPC ...................................................... H02S 10/00
USPC .......................................................... 307/43
See application file for complete search history.

(56) References Cited

U.S. PATENT DOCUMENTS

| | | |
|---|---|---|
| 4,697,761 A | 10/1987 | Long |
| 5,810,284 A | 9/1998 | Hibbs |
| 6,868,314 B1 * | 3/2005 | Frink ................ 701/3 |

(Continued)

FOREIGN PATENT DOCUMENTS

| | | |
|---|---|---|
| WO | 2010111295 A2 | 9/2010 |
| WO | 2010129566 A1 | 11/2010 |

OTHER PUBLICATIONS

International Search Report and Written Opinion of the International Searching Authority for PCT/US2013/026525, mailed Dec. 12, 2013.

(Continued)

*Primary Examiner* — Robert DeBeradinis
(74) *Attorney, Agent, or Firm* — McCarter & English, LLP; David R. Burns (57) ABSTRACT

Some embodiments include a kit for increasing endurance of a battery-powered unmanned aerial vehicle (UAV) by incorporating flexible solar cells or applying flexible solar cells on a surface of a UAV or on a surface of a component of a UAV. The kit further include a power conditioning system configured to operate the solar cells within a desired power range and configured to provide power having a voltage compatible with an electrical system of the UAV.

49 Claims, 10 Drawing Sheets

(56) References Cited

U.S. PATENT DOCUMENTS

| | | | |
|---|---|---|---|
| 7,398,946 B1 | 7/2008 | Marshall | |
| 7,762,495 B2 | 7/2010 | Miller | |
| 8,201,773 B1 * | 6/2012 | Durham et al. | 244/49 |
| 2011/0073717 A1 | 3/2011 | Foucault et al. | |

OTHER PUBLICATIONS

International Preliminary Report on Patentability of the International Bureau of WIPO for PCT/US2013/026525, issued Aug. 19, 2014.

Anonymous: "Solar Cells Increase UAV Stamina, Flight Time", Sep. 28, 2011, XP055091247.

Coba, Javier V.: "Application of Copper Indium Gallium Diselenide Photovoltaic Cells to Extend the Endurance and Capabilities of the Raven RQ-11B Unmanned Aerial Vehicle", Sep. 30, 2010, XP055091402.

Cornfeld, Arthur B. et al: "The 3J-IMM Solar Cell: Pathways for Insertion Into Space Power Systems", 2009 34th IEEE Photovoltaic Specialists Conference (PVSC), Jun. 1, 2009, pp. 000954-000959; XP055091351.

Author Unknown, "Microlink Devices Contract to Develop High-Efficiency Solar Sheets for UAVs Extended", 1 page, published Nov. 22, 2011, MicroLink Devices, Chicago, IL.

* cited by examiner

INTEGRATION OF HIGH-EFFICIENCY, LIGHTWEIGHT SOLAR SHEETS ONTO UNMANNED AERIAL VEHICLE FOR INCREASED ENDURANCE

RELATED APPLICATIONS

The present application claims benefit of, and priority to, U.S. Provisional Patent Application No. 61/599,390, filed Feb. 15, 2012, which is herein incorporated by reference in its entirety.

STATEMENT OF GOVERNMENT INTEREST

This invention was made with government support under Contract No. FA8650-09-D-5037 awarded by the Air Force Research Laboratory (AFRL). The government has certain rights in this invention.

BACKGROUND

Many of the current generation of unmanned aerial vehicles (UAVs) are electrically powered. Most electrically powered small UAVs are battery-powered, such as the RAVEN, Wasp III, and Puma AE by AeroVironment, Inc. of Monrovia, Calif., and the MAVERIC UAS by PRIORIA ROBOTICS of Gainesville, Fla. The endurance (i.e., total flight time of the vehicle with a full battery charge) of the current generation of small, electrically-powered unmanned aerial vehicles (UAVs) is limited by power consumed by the UAV and the energy storage capacity of the battery. For example, the endurance of the RAVEN UAV is limited to approximately 90 minutes of flight time. The limit on endurance of small UAVs reduces the operational effectiveness of the small UAVs because it limits the time the UAV can spend over a target of interest, and limits a distance range for targets.

SUMMARY

Some embodiments may increase an endurance of battery-powered unmanned aerial vehicles (UAV) by adding a secondary power source in the form of a plurality of solar cells attached to, or incorporated into, a surface of the UAV or of a component of the UAV. Endurance of a battery-powered UAV may be defined as a total flight time with an initially fully charged battery or as a total flight time with an initial specified battery charge level. The plurality of solar cells may have high specific power (ratio of power to mass) and may be relatively light in weight. Further, some embodiments include kits for increasing endurance of a battery-powered UAV.

In one embodiment, a kit for increasing endurance of a battery-powered UAV includes a component of a battery-powered UAV with a plurality of solar cells attached to or incorporated into the component. The component is configured to be installed on a battery-powered UAV. The kit also includes a power conditioning system configured to operate the plurality of solar cells within a desired power range and configured to provide power in the form of a voltage compatible with an electrical system of the UAV.

In some embodiments, the component may be at least a portion of a wing with the plurality of solar cells attached to, and/or integrated into the wing. The kit may be installed by installing a wing, or portion of a wing, on a previously-produced UAV aircraft (e.g., a stock, commercially-produced UAV, such as the RAVEN).

The power conditioning system may include a power conditioning circuit. In some embodiments, the power conditioning system also includes an electrical connection system configured to connect the power conditioning circuit with the plurality of solar cells and to connect the power conditioning circuit with an electrical system of the UAV. In some embodiments, the electrical connection system includes a wiring harness. In some embodiments, the power conditioning system is configured to charge a battery of the UAV with power supplied by the plurality of solar cells.

Another embodiment of the technology is directed to a kit for increasing endurance of a battery-powered UAV that includes a plurality of solar cells configured to be attached to a surface of a battery-powered UAV. In some embodiments, at least some of the plurality of solar cells are configured to be attached to a surface of a wing or wings of a UAV. In some embodiments, at least some of the plurality of solar cells are configured to be attached to a top surface of a wing. In some embodiments, at least some of the plurality of solar cells are configured to be attached to an underside of a wing. In some embodiments, at least some of the plurality of solar cells are be configured to be attached to a fuselage of an UAV. In some embodiments, at least some of the plurality of solar cells may be configured to be attached to a non-wing, non-fuselage surface of a UAV (e.g., a vertical stabilizer, a horizontal stabilizer).

In some embodiments, each of solar cells has a specific power of at least 800 W/kg, of at least 900 W/kg, or at least 1000 W/kg. In some embodiments, each of the solar cells has a specific power between 800 W/kg and 3000 W/kg, between 900 W/kg and 3000 W/kg, or between 1000 W/kg and 3000 W/kg.

In some embodiments, each of the solar cells has a thickness of less than 70 microns (e.g., between 12 and 70 microns).

In some embodiments, the plurality of solar cells is incorporated into at least one flexible solar sheet. In some embodiments, the at least one flexible solar sheet has a specific power of at least 400 W/kg, at least 600 W/kg, at least 700 W/kg, at least 900 W/kg, or at least 1000 W/kg. In some embodiments, the at least one flexible solar sheet has a specific power of 400-1200 W/kg, of 600-1200 W/kg, of 700-1200 W/kg, or of 900-1200 W/kg.

In some embodiments, the plurality of solar cell includes inverted metamorphic solar cells. In some embodiments the plurality of solar cells includes flexible triple-junction solar cells. In some embodiments, the plurality of solar cells includes single-junction solar cells, dual-junction solar cells and/or triple junction solar cells. In some embodiments the plurality of solar cells includes solar cells produced using an epitaxial lift off (ELO) process. In some embodiments, the plurality of solar cells includes an AlInGaP/GaAs/InGaAs IMM solar cell.

In some embodiments, a kit is configured to retrofit a previously-produced UAV. In some embodiments, the kit is configured for upgrading a UAV during production.

In some embodiments, the kit is configured to improve an endurance of a UAV by at least 50%, at least 80%, at least 90%, at least 100%, or at least 120% as compared with an endurance of the UAV without the solar power source.

In some embodiments, the kit is configured to provide between 40% and 99% of the average power consumed by the UAV during use.

In some embodiments, the kit is configured for increasing the endurance of a small, battery-powered UAV.

BRIEF DESCRIPTION OF THE DRAWINGS

The foregoing and other objects, features and advantages of the invention will be apparent from the following description, and from the accompanying drawings, in which like reference characters refer to the same parts throughout the different views. The drawings illustrate principles of the invention and are not to scale.

DETAILED DESCRIPTION

The endurance of the current generation of small, electrically-powered is limited due the operational power requirements for the UAV and the limited energy storage capacity of the battery (e.g., the endurance of the RAVEN small UAV is 60-90 minutes). Increasing endurance enhances the operational effectiveness of a small UAV because a UAV with enhanced endurance can spend more time over the target of interest and/or can travel to targets further away. Adding additional batteries may increase the endurance of a UAV; however the additional batteries would substantially increase the weight of the UAV, thereby reducing its payload or degrading its aerodynamic characteristics.

One of the problems addressed by some embodiments described herein is how to substantially increase the endurance of a UAV (e.g., a small battery-powered UAV such as the RAVEN or a larger UAV) without substantially increasing its size or weight. Some embodiments address this problem by providing a kit to equip a UAV with lightweight, flexible, high efficiency solar cells (e.g., one or more solar cell strings or sheets of solar cells) that supply additional power to the UAV, thereby significantly increasing the endurance of the UAV as compared to a UAV without solar cells. Because the solar cells have relatively small mass per unit area, they do not add significant weight to the UAV. In some embodiments, the solar cells have a high specific power (power to mass ratio) providing significant power generation for relatively little added weight. For small UAVs (e.g., portable UAVs that may be transported or deployed by a single person in the field) it is particularly important that the solar cells do not significantly increase the overall weight of the UAV, which could degrade the aerodynamic performance of the UAV and decrease its endurance.

As used herein, the term small UAV includes portable UAVs that may be carried by a single person. The term small UAV includes what may be referred to elsewhere as micro UAVs and mini UAVs and larger portable UAVs. Examples of small UAVs include the RQ-11B RAVEN UAV system with a weight of 1.9 kg and a wingspan of 1.4 m, the WASP Micro Air Vehicle (MAV) with a weight of 0.43 kg and a wingspan of 72 cm, and the RQ-20A Puma with a weight of 5.9 kg and a wingspan of 2.8 m produced by AeroVironment, Inc., the MAVERIC UAV with a 72 cm in wingspan and a loaded weight of about 1.1 kg from Prioria Robotics, Inc., and the SCANEAGLE with a 3.1 m wingspan and an 18 kg from Boeing Insitu. As used herein, the term small UAV does not include high-altitude, long-endurance (HALE) aircraft such as the, GLOBAL OBSERVER with a 53 m wingspan produced by AeroVironment, Inc., or the Phantom Eye UAV with a wingspan of 46 m by Boeing Phantom Works.

Some embodiments described herein are broadly applicable to different sizes and different types of electrically-powered UAVs. Some embodiments described herein are directed to small battery-powered UAVs. Some embodiments described herein are applicable to large UAVs.

Figure 1:
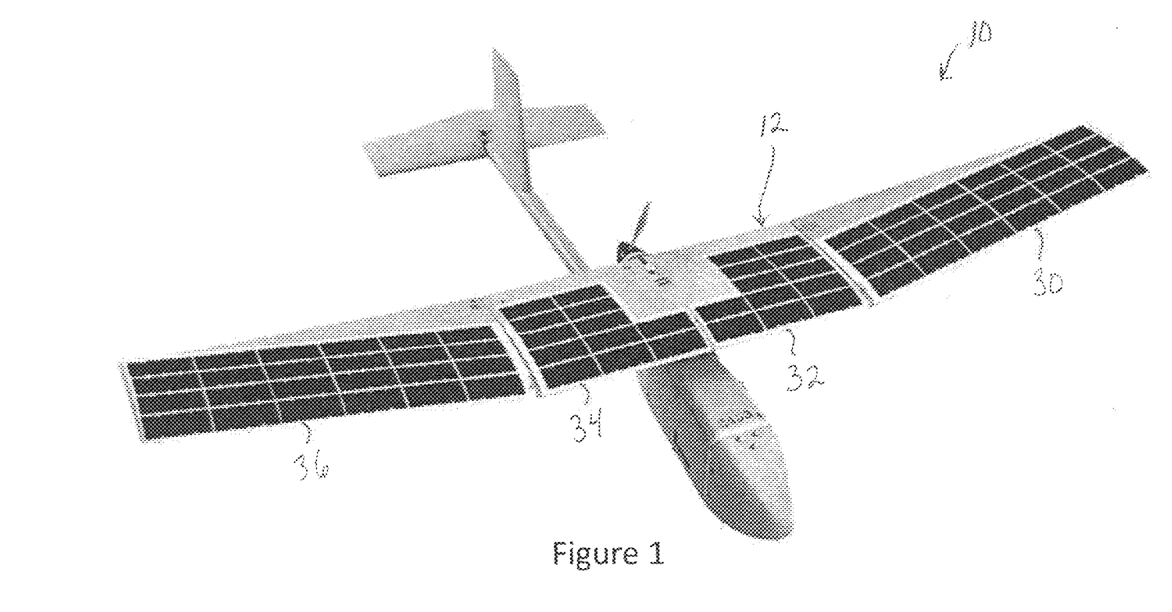
FIG. 1 depicts a perspective view of a kit including a plurality of solar cells installed on an unmanned aerial vehicle (UAV), in accordance with an embodiment.

In some embodiments, a kit including a plurality of solar cells (e.g., one or more strings of solar cells ("solar cell strings") or one or more sheets of solar cells ("solar sheets")) and a power conditioning system is used to increase endurance of a UAV. For example, FIG. 1 schematically depicts solar sheets 30, 32, 34, 36 of a kit mounted on a UAV 10 (e.g., a RAVEN UAV) that includes a battery power system. As shown, high efficiency flexible solar sheets 30, 32, 34, 36 have been mounted on a surface of the UAV (e.g., the wing 12 of the UAV). The kit also includes a power conditioning system configured to operate the solar cells within a desired power range or at a maximum power point and configured to provide a specified voltage to an electrical system of the UAV (see FIGS. 5-7 below). The power conditioning system may also be configured to charge an energy storage device (e.g., battery) of the UAV system (see FIG. 7 below).

In some embodiments, the plurality of solar cells (e.g., one or more solar cell strings or solar sheets) may be installed on a surface of a previously-produced UAV (e.g., as a post-manufacturing modification). For example, solar sheets of a kit may be applied to the wings of a previously-produced UAV. The power conditioning system and associated electrical wiring may be installed in the wings and fuselage of the previously-produced UAV and interfaced with the existing electrical system of the previously-produced UAV. In some embodiments, the kit may be an upgrade, retrofit, or aftermarket kit for installation on a previously-produced UAV.

Figure 2:
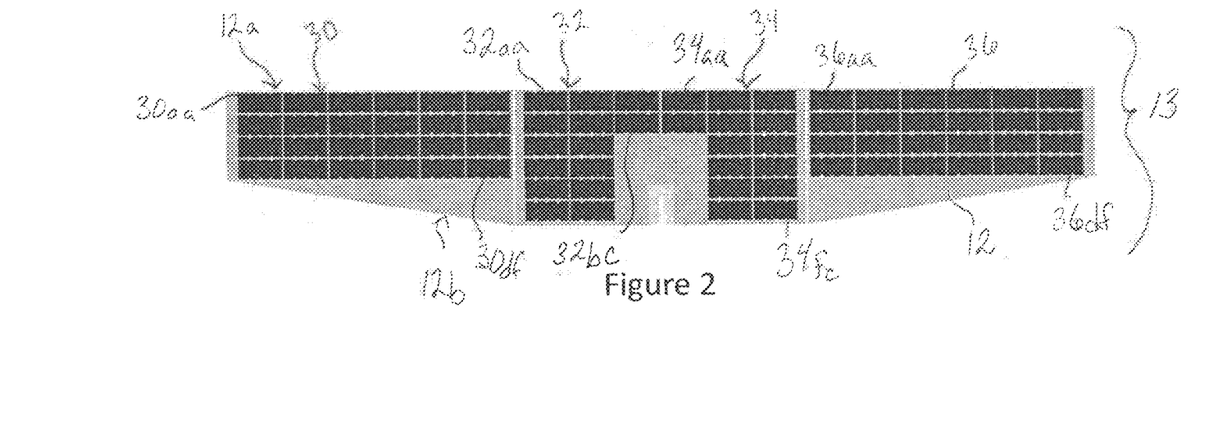
FIG. 2 schematically depicts a plan view of a wing component of a UAV with installed solar cells, in accordance with an embodiment.

In some embodiments, the plurality of solar cells (e.g., solar sheet(s)) may be mounted on or incorporated into a surface of a component of a UAV. The power conditioning system and associated electrical wiring (e.g., electrical harness) and connectors of the kit may be installed in the component. For example, FIG. 2 illustrates solar sheets 30, 32, 34, 36, each including multiple solar cells 30aa-30df, 32aa-32bc, 34aa-34fc, 36aa-36df, incorporated into a wing component 12 forming a wing assembly 13.

In some embodiments, the component with the solar sheet(s) (e.g., wing assembly 13) is used to replace a similar component in a previously-produced UAV as a post-manufacturing modification (e.g., as a retrofit or as an aftermarket modification). For example, a wing assembly including an installed kit may be used to replace a wing component in a previously-produced UAV.

In some embodiments, the component with the solar sheets (e.g., the wing assembly) is used during an initial manufacturing process of a UAV (e.g., as an upgrade). For example, a wing assembly with an installed kit may be incorporated into a UAV during initial manufacturing or assembly of the UAV as opposed to adding the solar cells and/or the power conditioning system to a previously-produced UAV.

Some embodiments may include an upgrade kit, a retrofit kit, or an aftermarket kit, for existing UAVs, such as the RAVEN UAV, the Wasp III UAV, the Puma AE UAV, and the MAVERIC UAS. Different embodiments of kits can be used with different types or different models of UAVs.

In some embodiments, the UAV may be designed with parts and connections configured for the incorporation of flexible, light weight, high efficiency solar cells. Incorporation of the solar cells into the UAV design may result in better aerodynamics, more robust electrical connections, and reduced additional weight to due to the solar cells, packaging and wiring harness. Some embodiments may include small UAVs specifically designed for hybrid battery/solar operation, such as UAVs that are primarily battery-powered with a secondary solar power system including flexible, lightweight, high-efficiency solar cells.

In the embodiments depicted in FIGS. 1 and 2, the plurality of solar cells is incorporated into four solar sheets. In other embodiments, the plurality of solar cells may be incorporated into less than four solar sheets (e.g., one, two or three solar sheets) or may be incorporated into more than four solar sheets. In some embodiments, the kit includes one or more solar sheets and one or more strings of solar cells or individual solar cells not incorporated into solar sheets. In some embodiments all of the plurality of solar cells are in the form of strings of solar cells or individual solar cells and not incorporated into solar sheets.

In the embodiment depicted in FIGS. 1 and 2 the solar cells are positioned close to a leading edge 12a of the wing with areas near the trailing edge 12b of the wing not covered by solar cells. In this particular embodiment, the center space near the trailing edge of the wing was left uncovered to avoid blocking reception of an internal antenna of the UAV. In other embodiments, additional solar cells could be mounted in the areas near the trailing edge 12b of the wing (e.g., by incorporating more solar cells into sheets 30 and 36 or by adding additional solar sheets) to increase the amount of solar power generated and thereby further enhance UAV endurance.

In the embodiments of FIGS. 1 and 2, the solar sheets are mounted on an upper surface of the wing 12. In some embodiments, solar cells (e.g., one or more solar sheets) are applied to other surfaces of the UAV or to other components of the UAV, including, but not limited to, one or more of: the horizontal stabilizer, the vertical stabilizer, the fuselage, and the underside of the wings. Solar cells on the sides and underside of the UAV collect light scattered from the ground as well as from the sun and sky.

The plurality of solar cells may be single-junction solar cells, multi-junction solar cells (e.g., double-junction solar cells, triple junction solar cells) or any combination of single-junction solar cells and multi-junction solar cells. Although triple junction solar cells generally have a higher efficiency than that of single junction or double-junction solar cells, triple junction solar cells are generally more complicated to produce and may have a narrower wavelength range for high efficiency performance. The efficiency of the dual-junction and single-junction cells is less sensitive to the spectrum of the incident light than that of a triple-junction cell, so more energy may be obtained from dual-junction or single-junction cells when the cells are exposed to scattered light, rather than to direct sunlight. Accordingly, in some embodiments it may be desirable to use dual-junction or single-junction cells on the underside of the wings or the fuselage where the ratio of scattered light to direct sunlight is greater than for a top side of the wings.

The solar cells in the kit must be flexible to conform to an underlying curved aerodynamic shape of a surface of UAV or of a UAV component onto which they will be mounted or into which they will be incorporated. Solar cells for a small UAV may need to be more flexible than solar cells for a large UAV due to the higher curvatures present in surfaces of small UAVs. Further, flexible solar cells are more durable than similar non-flexible or less flexible (i.e., more brittle) solar cells during installation, and during use.

As noted above, the solar cells in the kit should have a total mass that is relatively small compared to the mass of the UAV and should have a relatively low mass per unit area. This criterion is more difficult to meet for small UAVs than for large UAVs because the total mass of the small UAVs is relatively small.

Because additional mass tends to increase the power required to operate a battery-powered UAV, the power supplied by the solar cells of the kit must more than compensate for the increase in the UAV mass due to the presence of the kit to increase endurance of a battery-powered UAV. Thus, only solar cells having sufficient specific power (power per unit mass) would increase the endurance of a battery-powered UAV.

In some embodiments, a specific power of the plurality of solar cells is at least a threshold value (e.g., at least 500 W/kg, at least 800 W/kg, at least 1000 W/kg, at least 1100 W/kg). In some embodiments, the specific power of the solar cells falls within a specified range (e.g., 500-3000 W/kg, 800-2800 W/kg, 800-2500 W/kg, 900-2500 W/kg).

The specific power of a solar cell depends on the efficiency of the solar cell (electrical energy produced divided by solar energy absorbed for a unit area of the solar cell) and the mass per unit area of the solar cell. Thus, a solar cell with a relatively high specific power has a relatively high efficiency and/or a relatively low mass per unit area. Solar cells free of a substrate (e.g., solar cells produced using epitaxial lift off (ELO)) may be particularly well suited for a kit because they have a reduced mass per unit area and greater flexibility as compared to solar cells attached to an underlying substrate.

In general, if the materials of a solar cell remain the same, decreasing the thickness of the solar cell increases the flexibility of the solar cell. As noted above, increased flexibility allows the solar cell to conform to an aerodynamic shape of a UAV surface or of the surface of a UAV component and increases the durability of the solar cell. In some embodiments, each solar cell may have a thickness of less than a specified thickness (e.g., less than 125 μm, less than 100 μm, less than 70 μm, less than 50 μm, less than 40 μm). In some embodiments, each solar cell may have a thickness that falls in a specified range (e.g., 12-125 μm, 12-100 μm, 12-70 μm, 20-50 μm, 12-40 μm).

As noted above, at least some of a plurality of solar cells may be incorporated into a flexible solar sheet. For example, in some embodiments, lightweight solar cells (or strings of solar cells) are disposed between polymer films to form flexible solar sheets to aid in easier handling and installation, and to provide greater protection of the solar cells. The flexible solar sheets conform to curved aerodynamic surfaces. In some embodiments the flexible solar sheets provide robust waterproof packaging. The flexible solar sheets may be applied to or incorporated into a surface of a UAV or of a component of a UAV.

Figures 3, 4:
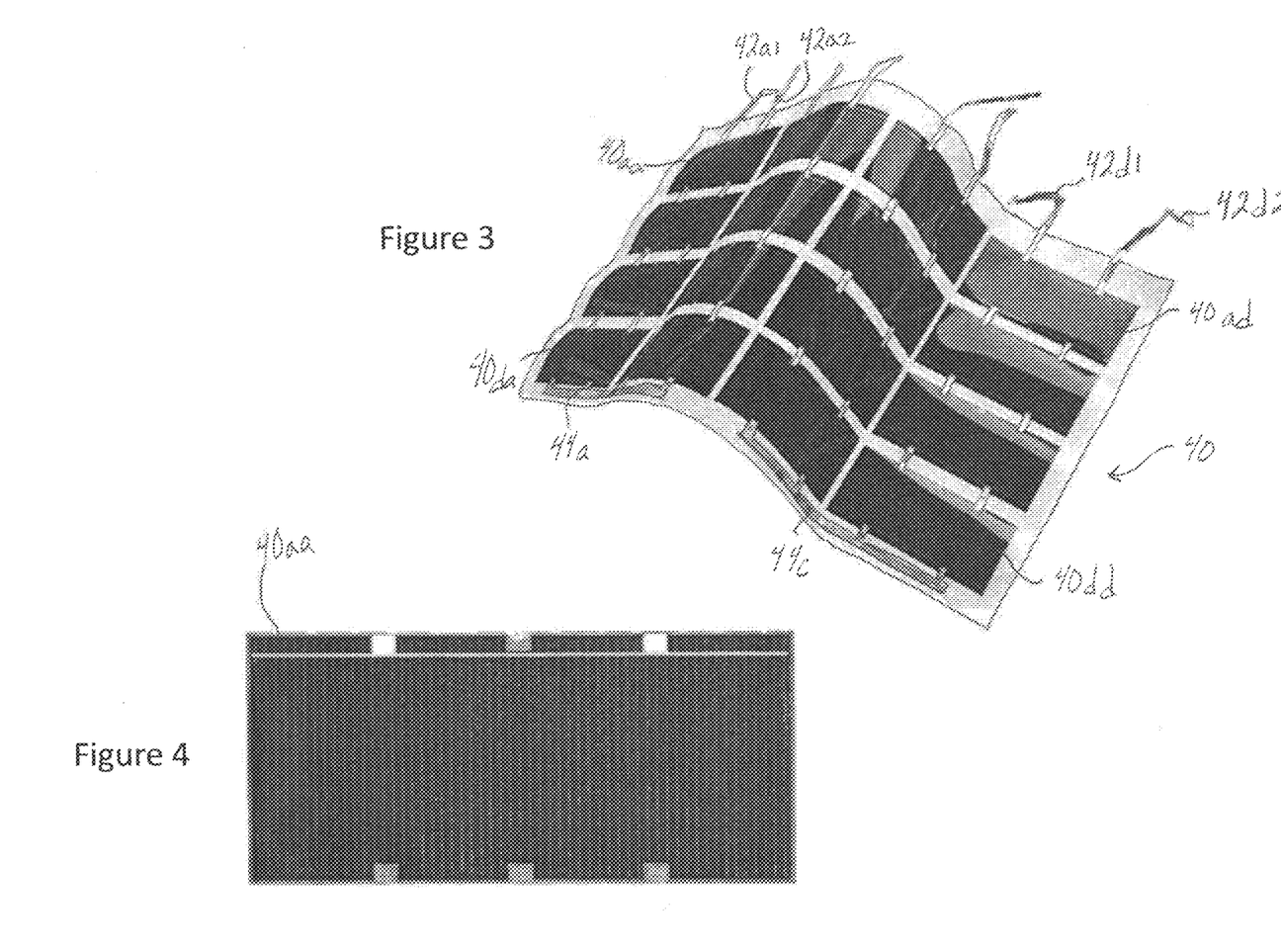
FIG. 3 is a perspective view of a solar sheet including a plurality of solar cells illustrating the flexibility of the solar cells and of the solar sheet, in accordance with an embodiment.
FIG. 4 schematically depicts a plan view of an exemplary solar cell, in accordance with an embodiment.

FIG. 3 illustrates the flexibility of a solar sheet 40, in accordance with an embodiment. FIG. 4 illustrates a plan view of a single solar cell 40aa. The flexible solar sheet may also include electrical components such as electrical interconnections between solar cells or electrical leads. As shown in FIG. 3, within a solar sheet 40 multiple solar cells may be electrically connected in columns and/or rows (e.g., cells 40aa-40da are connected in a solar cell string, cells 40ad-40dd are connected in a solar cell string). As also shown in FIG. 3, a solar sheet may include components for making electrical connections to the solar sheet (e.g., leads 42a1, 42a2 associated with one column, leads 42d1, 42d2 associated with another column and ground connections 44a and 44c).

Due to added mass of polymer materials in solar sheets, a solar sheet of a plurality of solar cells has a lower specific power than the specific power of the solar cells themselves. Also, if the solar sheet has a top layer, the top layer may reduce the efficiency of the solar sheet (e.g., by absorbing some of the incident light before it reaches the solar cell). In some embodiments, a solar sheet has a specific power of at least a specified value (e.g., least 180 W/kg, at least 250 W/kg, at least 300 W/kg, at least 350 W/kg, at least 400 W/kg.) In some embodiments, a solar sheet has a specific power falling with a specified range (e.g., 180-1100 W/kg, 250-1100 W/kg, 300-1100 W/kg, 350-1100 W/kg, 400-1100 W/kg).

The overall increase in mass of the UAV due to installation of the kit should be small relative to the total weight of the UAV. For example, in some embodiments the installed kit increase weight of the UAV by less than 2%, by less than 5%, by less than 10%, by less than 15%, or by less than 20%. As noted above, this requirement may be more challenging for small UAVs than for large UAVs.

Solar cells for the kit may be based on any number of suitable semiconductor materials like III-V semiconductor materials (e.g., GaAs-based materials, InP-based materials, etc.) and Si-based materials. The solar cells may be single junction solar cells, multi-junction solar cells (e.g., double-junction, triple-junction), or a combination of single junction and multi-junction solar cells. In general, higher efficiencies can be obtained with multi-junction solar cells than with single junction solar cells, however, multi-junction solar cells are more complicated to make and can be more expensive. Examples of solar cells having relatively high efficiencies include triple junction inverted metamorphic (IMM) solar cells, which may be produced using ELO or using methods that do not employ ELO. As a specific example, triple junction IMM solar cells with an InGaP/GaAs/InGaAs grown inverted on GaAs by the inventors demonstrated efficiencies of greater than 29% for AM0.

Further information regarding III-V semiconductor solar cells produced by ELO (e.g., single junction, multi-junction and IMM solar cells), and how to manufacture III-V semiconductor ELO solar cells may be found in U.S. Pat. No. 7,994,419 to Pan et al. issued Aug. 9, 2011, which is incorporated by reference herein in its entirety. Further information regarding InP-based solar cells produced by ELO (single junction, multi-junction and IMM) and how to manufacture InP-based ELO solar cells may be found in U.S. patent application Ser. No. 13/631,533, filed Sep. 28, 2012, which is incorporated by reference herein in its entirety.

Figure 5:
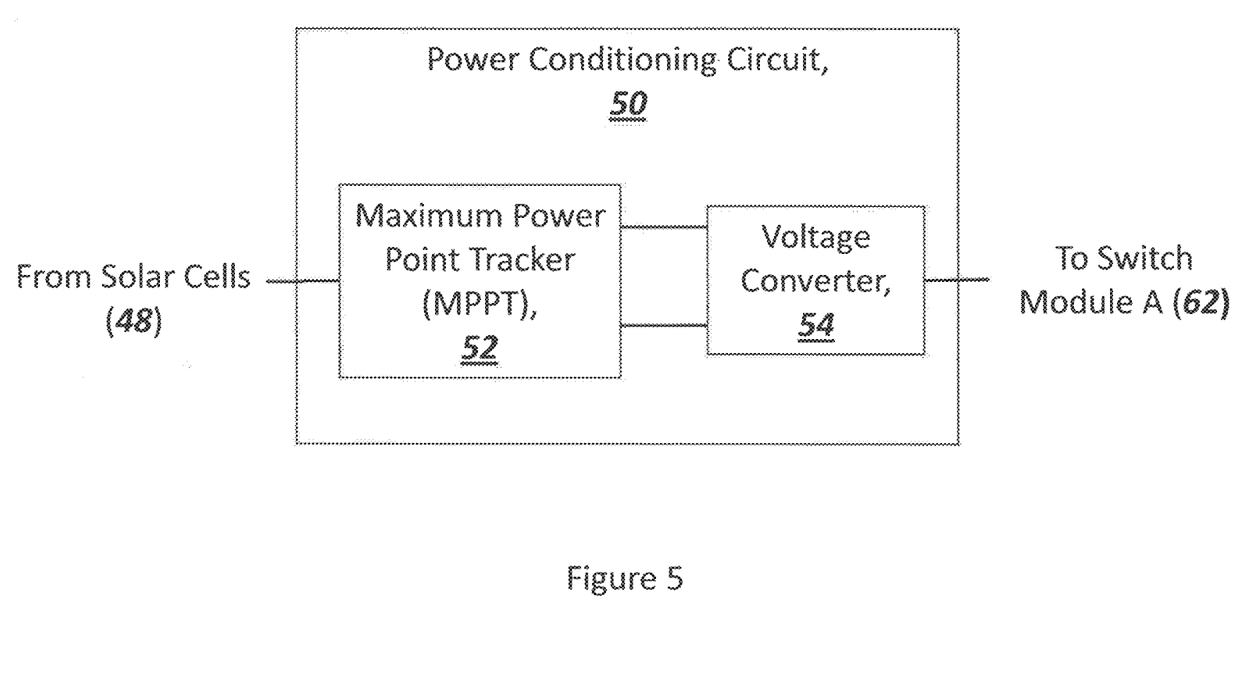
FIG. 5 is a block diagram of a power conditioning circuit (PCC) in accordance with an embodiment.

The kit also includes a power conditioning system configured to operate the plurality of solar cells within a desired power range and configured to provide a specified voltage to an electrical system of the UAV. FIG. 5 is a block diagram of a power conditioning circuit 50 included in the power conditioning system in accordance with some embodiments. The power conditioning circuit 50 includes a maximum power point tracker (MPPT) 52 connected with the solar cells. The MPPT 52 is configured to operate the solar cells within a desired power range. Any type of suitable MPPT component or circuit may be employed. The power conditioning circuit also includes a voltage converter 54 that converts voltage from the MPPT into a voltage compatible with the electrical system of the UAV. Any suitable voltage conversion component or circuit may be employed (e.g., a buck voltage converter (DC to DC voltage reduction), a boost voltage converter (DC to DC voltage increase)). In this embodiment, the voltage converter 54 is connected to an electrical system of the UAV through a switch (switch A 62).

Figure 6:
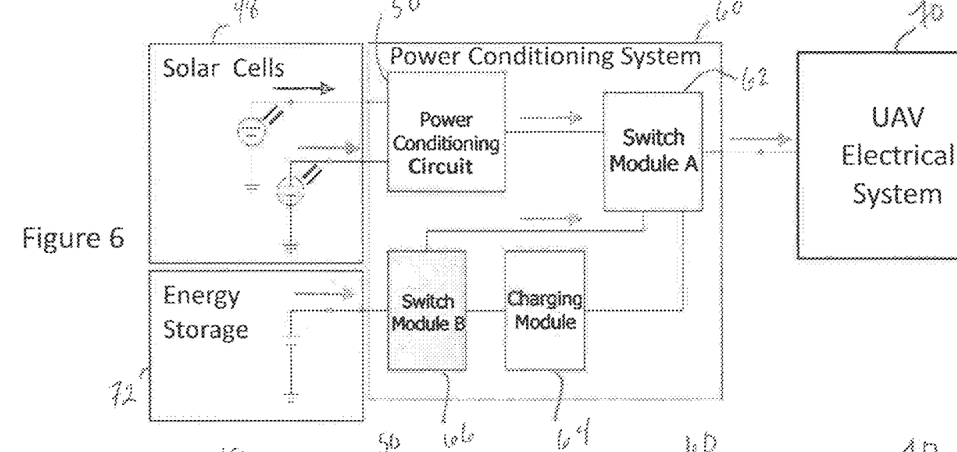
FIG. 6 is a block diagram of a power conditioning system in a first mode in which the solar cells provide supplemental power for a UAV.
Figure 7:
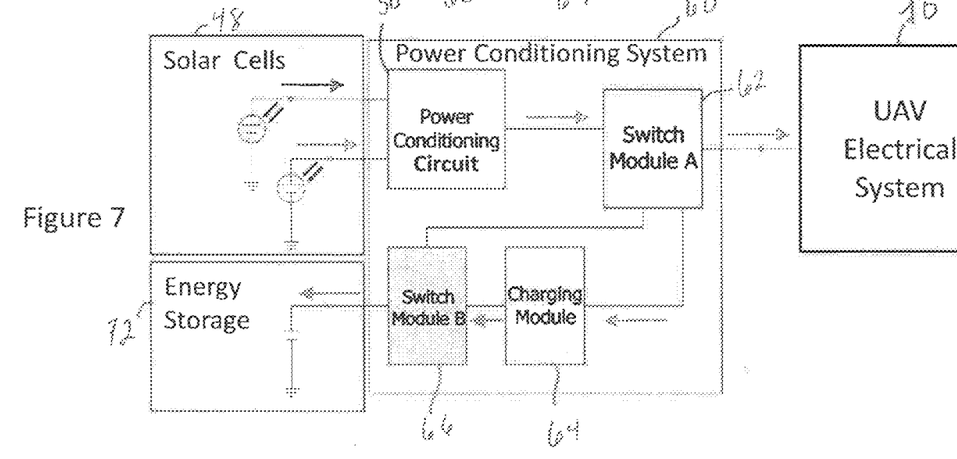
FIG. 7 is a block diagram of the power conditioning system in a second mode in which the solar cells provide operating power for the UAV and charge an energy storage device of the UAV system.

In some embodiments, the power conditioning system may also be configured to charge energy storage device (e.g., a battery) of the UAV. FIGS. 6 and 7 are block diagrams representing a power conditioning system 60 configured to charge an energy storage device of the UAV in accordance with some embodiments. Power conditioning system 60 includes the power conditioning circuit 50 and switch module A 62, which connects with the UAV electrical system 70. As shown, power conditioning system 60 may also include a charging module 64 and a switch module B 66 that connect with an energy storage element 72 (e.g., a battery) of the UAV.

In FIG. 6, the system is operating in a first mode in which the solar cells 48 supply just a portion of the power being used by the UAV electrical system 70. In this mode, through switch module B, the energy storage device 72 (e.g., battery) supplements the power supplied by the solar cells for the UAV's electrical system 70. As indicated by arrows, the charging module 64 is bypassed in this mode. In FIG. 7, the system is operating in a second mode in which the power supplied by the solar cells 48 exceeds the power being used by the UAV electrical system 70 and the excess generated power is directed through the charging module 54 and switch module B 66 to charge the energy storage 72 (e.g., a battery). A third mode of operation in which the power supplied by the solar cells exactly matches the power used by the electrical system is not depicted because, generally speaking, the third mode only occurs when shifting from the first mode to the second mode and vice-versa). In some embodiments, a UAV incorporating a secondary solar power system could be charged with exposure to sunlight before flight as well as during flight.

Electrical connections (e.g., power bus lines, wiring harness) connecting the solar cells, the power conditioning system, the electrical system of the UAV and the energy storage device (e.g., battery) of the UAV may be integrated into one or more components of the UAV (e.g., the wings or the fuselage).

Figure 8:
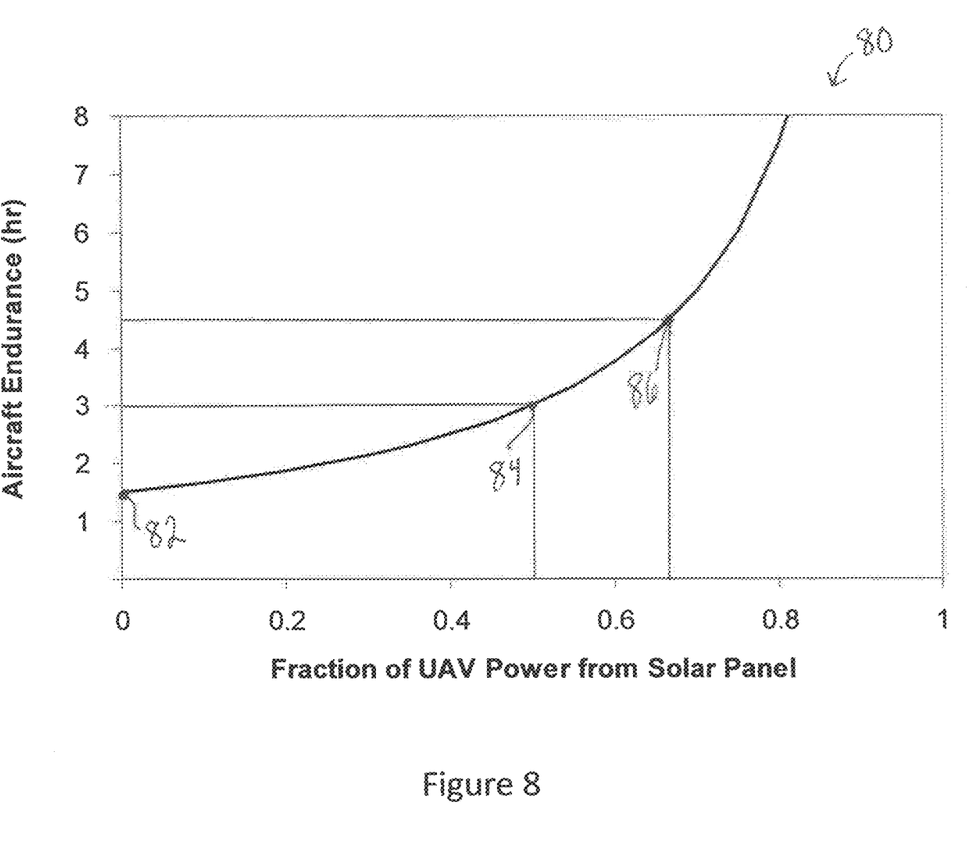
FIG. 8 is a graph representing UAV endurance as a function of the fraction of the UAV power from solar cells for a theoretical model.

FIG. 8 is a theoretical graph 80 of the endurance (total flight time) of a generic UAV as a function of the fraction of the average UAV power consumption that is provided by the solar cells. Note that the endurance enhancement is not a linear function of power provided by the solar panels. Instead, the marginal endurance enhancement provided by a given solar cell capacity increases as the overall fraction of the UAV power provided by the solar panel increases. For example, for a UAV having an endurance of 1.5 hours without solar enhancement (point 82), the graph shows that endurance is doubled to 3 hours (i.e., a 100% increase) by providing 50% of the average power from the solar cells (point 84). A further 1.5 hr enhancement to 4.5 hr is achieved by supplying only an additional 17% of the average power consumption from the solar cells (point 86). Note that the model assumes sufficient available light. For example, for times greater than 8 hours, the aircraft endurance is limited practically due to the available hours of sunlight in a day, which is not shown in the model.

Some embodiments increase an endurance of a UAV by at least 50%, by at least 80%, by at least 100%, by at least 150%, or by at least 200% as compared to a similar UAV that is only battery-powered. In some embodiments, the kit is configured to supply, when installed, 20-100%, 40-100%, 50-100%, 60-100%, or 80-100% of the total average power during use.

Figure 9:
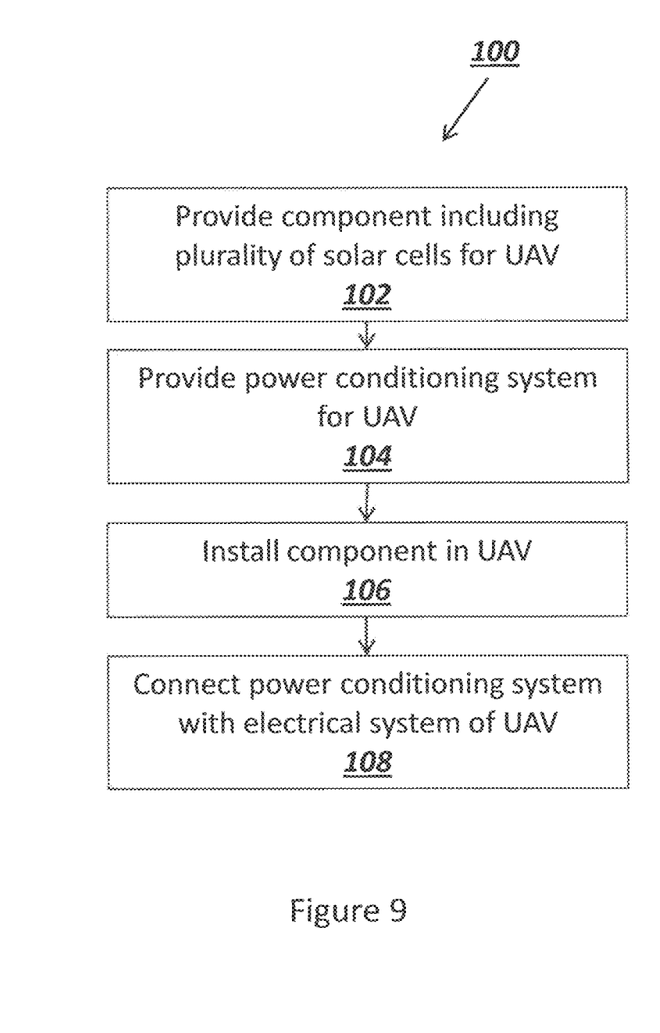
FIG. 9 is a block diagram of a method of increasing endurance of a battery-powered UAV in accordance with an embodiment.

Some embodiments include methods of increasing an endurance of a battery-powered UAV. For example, in method 100 of FIG. 9, a component that includes a plurality of solar cells is provided for a UAV (step 102). In some embodiments the component is at least a portion of a wing for a UAV. A power conditioning system configured to operate the plurality of solar cells within a desired power range and configured to provide power in the form of a voltage compatible with an electrical system of a UAV is provided (step 104). The component is installed in a UAV (step 106). In some embodiments the provided component replaces a previously-produced component of a previously-produced UAV. In some embodiments, the component is installed in the UAV during manufacturing of the UAV. The power conditioning system is connected with an electrical system of the UAV (step 108).

Figure 10:
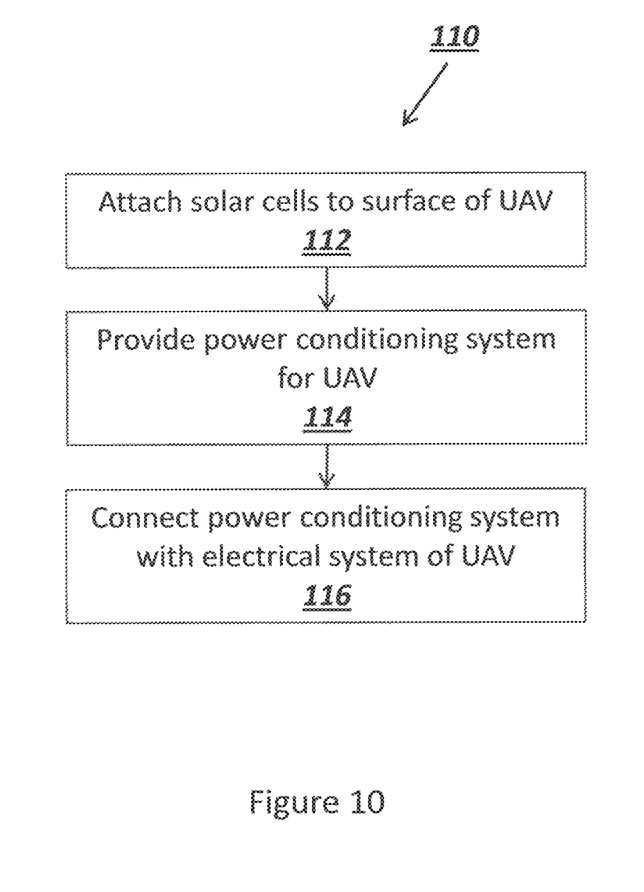
FIG. 10 is a block diagram of another method of increasing endurance of a battery-powered UAV in accordance with an embodiment.

Method 110 of FIG. 10 depicts another method of increasing an endurance of a battery-powered UAV. A plurality of solar cells is attached to a surface of a battery-powered UAV (step 112). The plurality of solar cells may be attached to a surface of a wing of the UAV. In some embodiments the solar cells are attached to a surface of a previously-produced UAV. In some embodiments, the solar cells are attached during initial production of the UAV. A power conditioning system configured to operate the plurality of solar cells within a desired power range and configured to provide power in the form of a voltage compatible with an electrical system of the UAV is provided (step 114). The power conditioning system is connected with the electrical system of the UAV (step 116).

EXAMPLE

The inventors installed an example kit including solar cells and a power conditioning circuit in a small, battery-powered UAV, specifically a RAVEN UAV. The modified UAV with the installed kit demonstrated a significant increase in endurance as compared with an identical UAV without the kit. A plurality of solar cells in the form of four solar sheets was integrated into a wing component of a battery-powered RAVEN UAV in the configuration shown in FIG. 2. The wing 12 modified to include a wiring harness that would supply solar power to the UAV battery and vehicle. The wing assembly including the solar sheets and associated electronics was installed on a previously-produced RAVEN UAV as shown in FIG. 1. Further details regarding the solar cells and the solar sheets employed are described below with respect to FIGS. 14 and 15.

Figure 11:
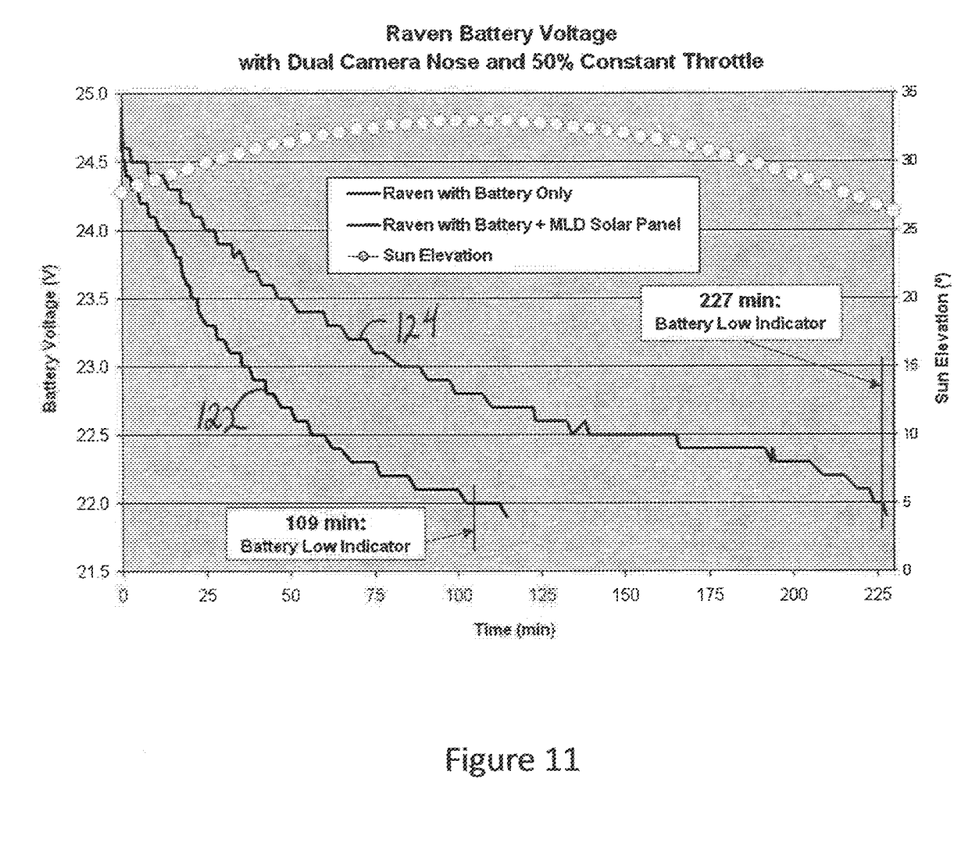
FIG. 11 is a graph of battery voltage as a function of time for a battery-only UAV and for a UAV supplemented with an example kit including solar cells with the UAVs at 50% throttle on the ground.
Figure 13:
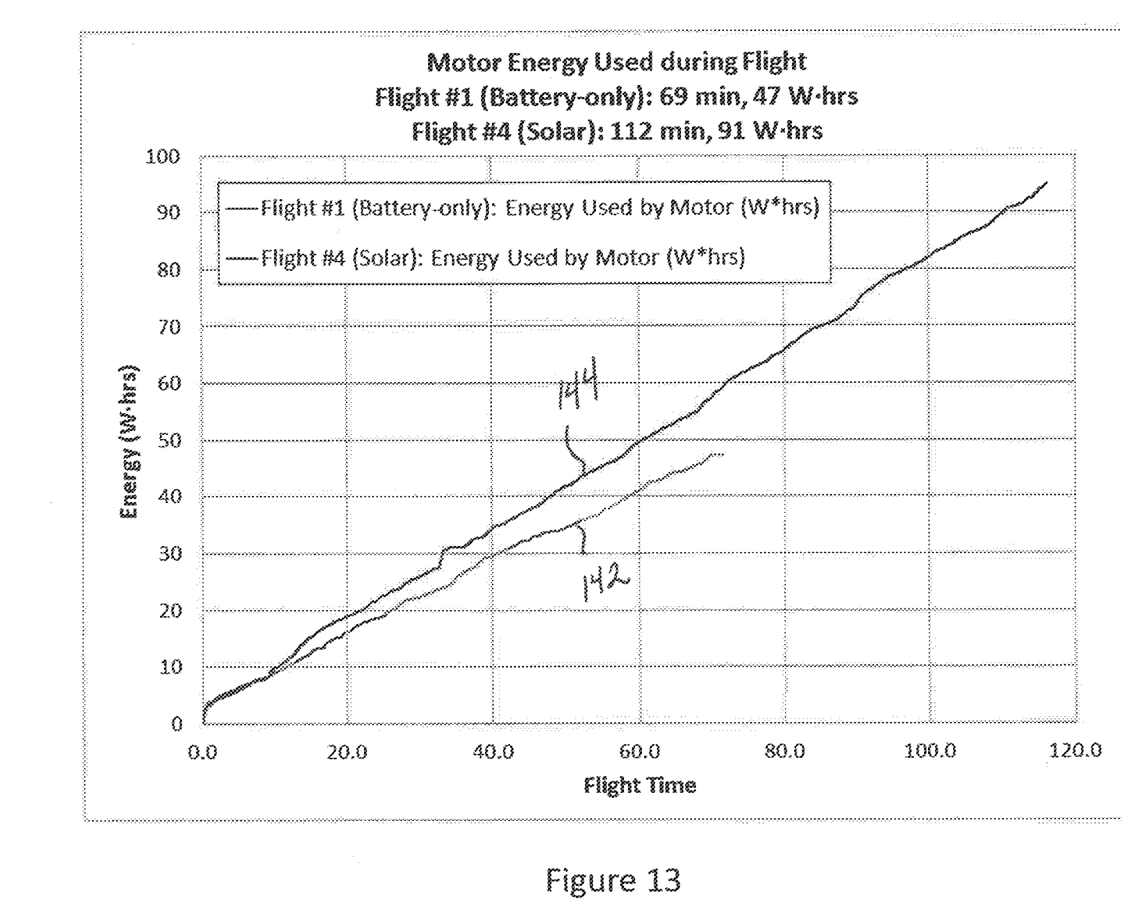
FIG. 13 is a graph of energy used by a motor as a function of time during flight for the battery-only UAV and for the UAV supplemented with the example kit.

FIG. 11 shows a comparison of the battery voltage of the modified (solar kit installed) UAV (124) and the battery voltage of the standard (battery-only) UAV (124). The UAVs were both operated at 50% throttle while sitting on a test stand until the battery voltage fell below the voltage at which the "Battery Low" indicator was activated (i.e., 22 V). The "endurance" was measured while the UAVs were stationary on the test stand as the time between starting the power of the UAV and the battery reaching 22 V. As shown in FIG. 13, the modified UAV with solar sheets had an "endurance" of 228 minutes as compared with an "endurance" of 109 minutes for the unmodified battery-only UAV, which was an increase of 109%. This data is not true flight "endurance" data because the UAVs were not in flight; however, the results established that the solar cells provided significant amounts of additional energy to the UAV.

Figure 12:
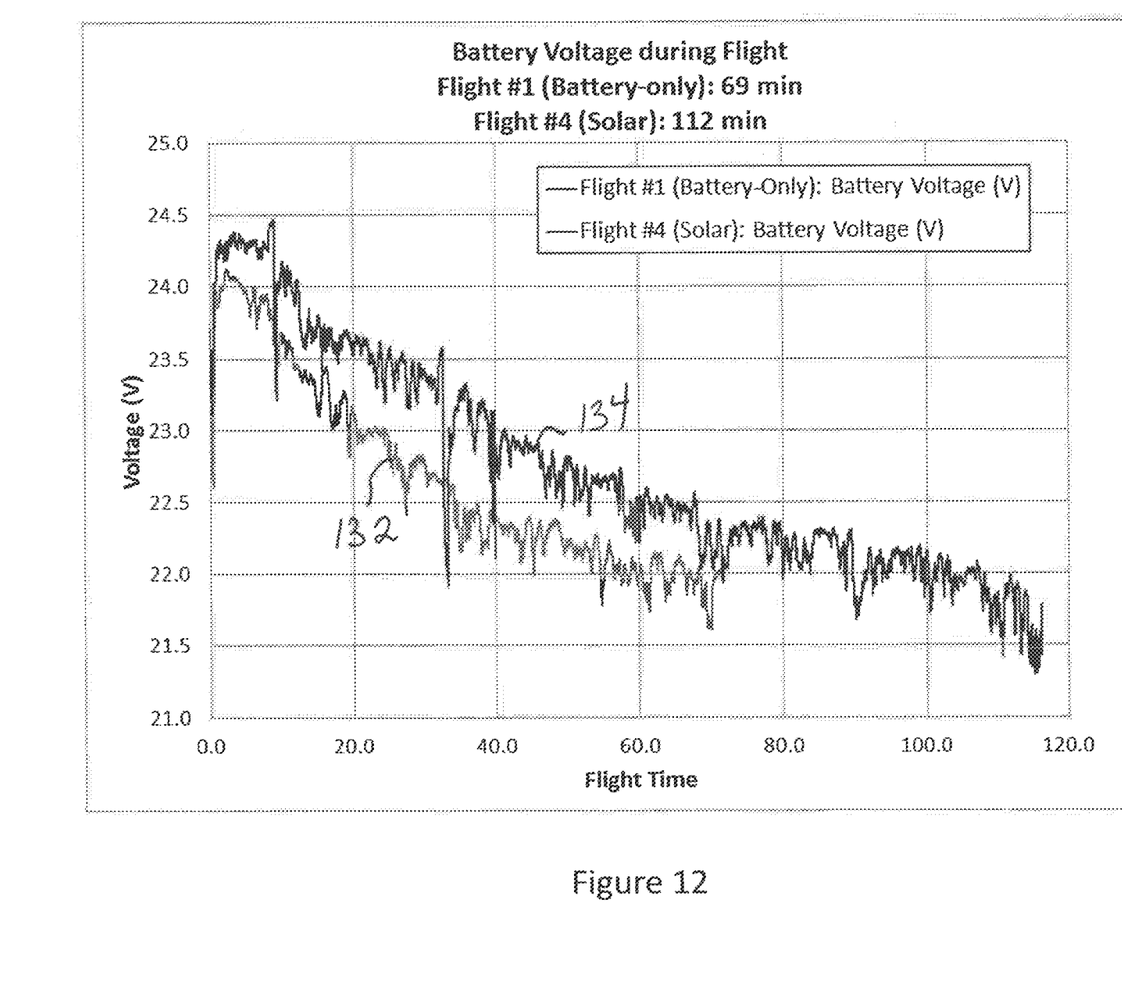
FIG. 12 is a graph of battery voltage as a function of time during flight for a battery-only UAV and for a UAV supplemented with an example kit including solar cells.

FIGS. 12 and 13 below show comparative data taken during flight tests. Another RAVEN UAV was modified in a similar manner and flight tests were conducted for the modified (solar kit installed) UAV as compared with an unmodified battery-only UAV. FIG. 12 shows a comparison of the battery voltage of the modified (solar kit installed) UAV (134) and the battery voltage of the standard (battery-only) UAV (132) during flight. The endurance was measured as the time between takeoff of the UAV and the battery reaching 22 V. As shown in FIG. 12, in the standard, battery-only configuration (F132) the UAV operated for 69 minutes before the battery voltage dropped to 22 V. When retrofitted with wings integrated with solar sheet technology (134), the UAV operated for 112 minutes before the battery voltage dropped to 22 V, which is an increase in endurance of 62%.

FIG. 13 shows the total energy used by the UAV motor during flight for the standard battery-only UAV (142) and for the modified UAV with solar sheets (144). The total energy usage for the UAV motor was 47 W-hrs for the standard UAV (142) and 91 W-hrs for the modified UAV with solar sheets (422). Thus, the solar sheets provided an additional 44 W-hrs of energy to the motor of the UAV.

The solar cells used in the solar sheets installed on the UAVs were triple-junction AlInGaP/GaAs/InGaAs inverted metamorphic (IMM) solar cell made using an ELO process. Specifically, the cell included an AlInGaP top cell, a GaAs middle cell and an InGaAs bottom cell overlaying a metal backing layer. As noted above, additional details regarding manufacturing of the triple-junction IMM solar cell may be found in U.S. Pat. No. 7,994,419, which is incorporated by reference herein in its entirety. The solar cell thickness was less than 40 microns. The solar cells flexibly conformed to curved surfaces of the RAVEN model UAV. The triple-junction IMM solar cell had a mass density of less than 250 g/m$^2$.

Figure 14:
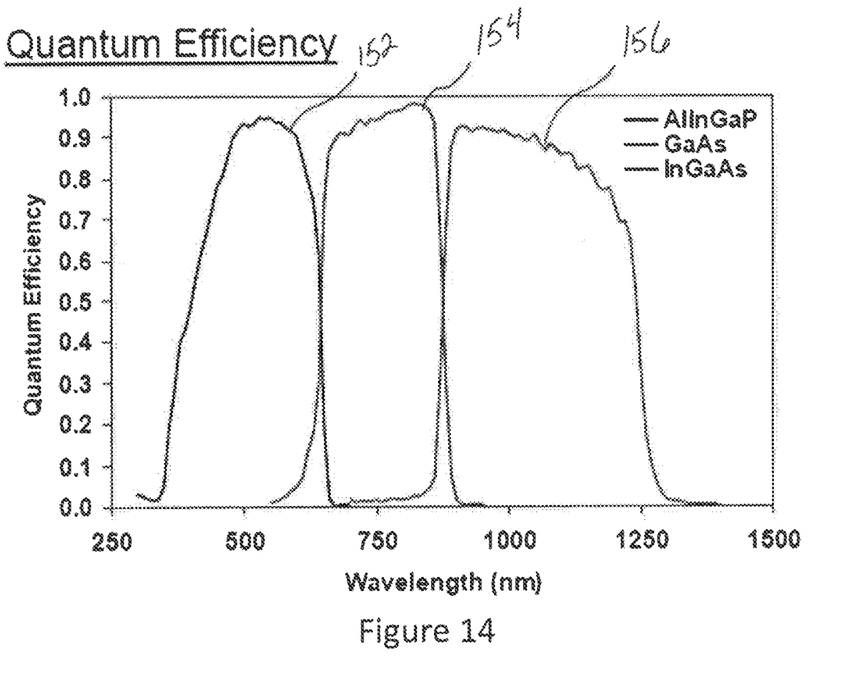
FIG. 14 is a graph of quantum efficiency for subcells of a triple junction inverted metamorphic (IMM) solar cell used in the example kit.
Figure 15:
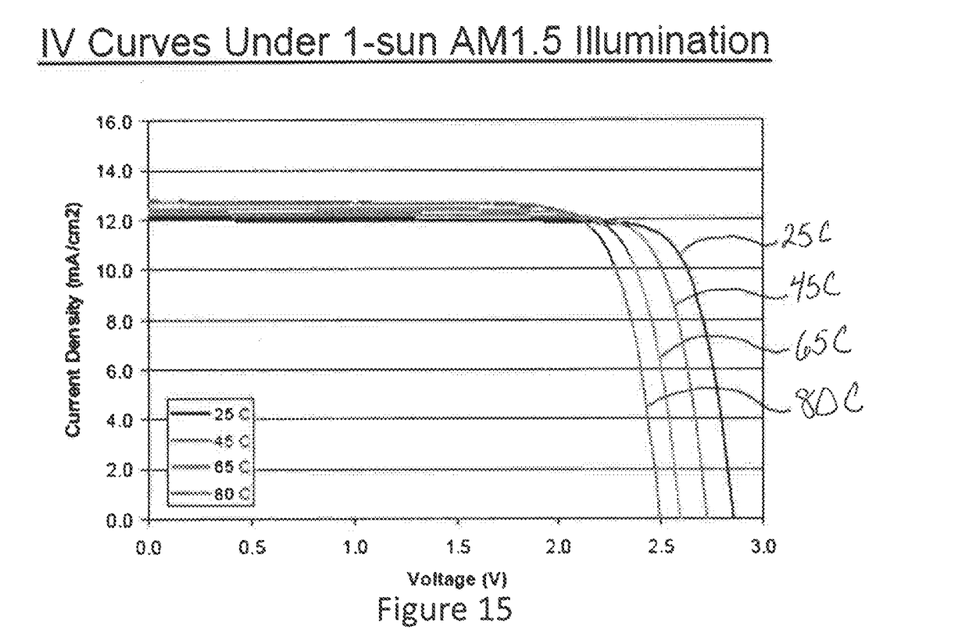
FIG. 15 is a graph of IV data for the IMM solar cells used in the example kit.

FIG. 14 is a graph showing the quantum efficiency of the individual sub cells, specifically the top cell AlInGaP (152), the middle cell GaAs (154), and the bottom cell InGaAs (156). The solar cell had a demonstrated efficiency of greater that 30% under 1-sun AM 1.5. FIG. 15 is a graph of I-V curves under 1-sun AM 1.5 illumination for different temperatures. The table below lists the critical cell parameters for the IMM triple-junction solar cell at various temperatures and the temperature dependence of various cell parameters.

| Critical Cell Parameters | | | |
|---|---|---|---|
| Temperature (° C.) | $J_{sc}$ (mA/cm$^2$) | $V_{oc}$ (V) | Efficiency (%) |
| 25 | 12.07 | 2.83 | 30.0 |
| 45 | 12.26 | 2.70 | 28.8 |
| 65 | 12.47 | 2.57 | 27.6 |
| 80 | 12.74 | 2.47 | 26.7 |

| Temperature Dependence of Cell Parameters | | |
|---|---|---|
| Quantity | Value | Units |
| $\Delta J_{sc}/\Delta T$ | 0.0118 | mA cm$^{-2}$ K$^{-1}$ |
| $\Delta V_{oc}/\Delta T$ | −0.0065 | mV K$^{-1}$ |
| $\Delta$Efficiency/$\Delta T$ | −0.06 | % K$^{-1}$ |

The power per unit area of the solar cell was greater than 250 W/m$^2$ with AM 1.5 illumination. The specific power of the solar cell was greater than 1,000 W/kg.

The solar cells were interconnected to form an array. The triple junction IMM solar cells produced by ELO were laminated between polymer films to form flexible solar sheets. Specifically, the solar array was packaged between two sheets of a polymer material (such as TEFLON) using sheets of transparent pressure sensitive adhesive (PSA) to attach the array to the polymer sheets. The top and bottom polymer sheets were transparent; however, in other embodiments the bottom polymer sheet need not be transparent. The antireflection coating of the cells was designed to give optimum performance with the polymer sheet and PSA. Electrical leads protruded from the solar sheets. The solar sheets were mounted on the top surface of the wing of the UAV using a sheet of PSA. The power conditioning circuitry (PCC) was installed in the UAV, specifically in the wing. In other embodiments the PCC could be disposed at least partially in the fuselage. The PCC was connected to the solar sheets using the leads. Another set of leads routed the output of the PCC to the battery. The output of the PCC was connected in parallel with the output of the battery.

The flexible solar sheets had a demonstrated efficiency of at least 30%. The flexible solar sheets had an areal mass density of less than 250 g/m2, and a power per unit area of greater than 250 W/m2 in AM 1.5 illumination. The flexible solar sheets had a specific power of greater than 430 W/kg. The solar sheets were about 215 μm thick.

In some embodiments, the plurality of solar cells are integrated into a component of a UAV. For example, solar sheets may be produced as described above and then the solar sheets incorporated into a wing as the wing is produced using a molding process.

Although some embodiments are described herein with respect to battery-powered UAVs, one of ordinary skill in the art will recognize that this disclosure also applies UAVs incorporating other types of devices for storing electrical energy (e.g., fuel cells). Thus, kits and methods for increasing the endurance of electrically-powered UAVs (e.g., fuel-cell powered UAVs, battery-powered UAVs) fall within the scope of this disclosure.

While the present invention has been described with reference to illustrative embodiments thereof, those skilled in the art will appreciate that various changes in form in detail may be made without parting from the intended scope of the present invention as defined in the appended claims.

The invention claimed is:

1. A kit for increasing endurance of a battery-powered unmanned aerial vehicle (UAV), the kit comprising:
   a component of an unmanned aerial vehicle, the component including a plurality of solar cells and the component configured to be installed on a battery-powered UAV, wherein each of the plurality of solar cells has a specific power of 1000-3000 W/kg; and
   a power conditioning system configured to operate the plurality of solar cells within a desired power range and configured to provide power in the form of a voltage compatible with an electrical system of the UAV.

2. The kit of claim 1, wherein the component is at least a portion of a wing.

3. The kit of claim 1, wherein the power conditioning system includes a power conditioning circuit.

4. The kit of claim 3, wherein the power conditioning system further comprises an electrical connection system configured to connect the power conditioning circuit with the plurality of solar cells and to connect the power conditioning circuit with an electrical system of the UAV.

5. The kit of claim 1, wherein the power conditioning system is further configured to charge a battery of the UAV with power supplied by the plurality of solar cells.

6. The kit of claim 1, wherein each of the plurality of solar cells has a thickness of less than 70 microns.

7. The kit of claim 1, wherein each of the plurality of solar cells has a thickness of between 12 microns and 70 microns.

8. The kit of claim 1, wherein the plurality of solar cells is incorporated into at least one flexible solar sheet.

9. The kit of claim 8, wherein the at least one flexible solar sheet has a specific power of between about 100 W/Kg and about 2500 W/kg.

10. The kit of claim 8, wherein the at least one flexible solar sheet has a specific power of between about 400 W/kg and about 1200 W/kg.

11. The kit of claim 1, wherein the plurality of solar cells comprises inverted metamorphic solar cells.

12. The kit of claim 1, wherein the plurality of solar cells comprises solar cells produced using an epitaxial lift-off process.

13. The kit of claim 1, wherein the plurality of solar cells comprises inverted metamorphic solar cells produced using an epitaxial lift-off process.

14. The kit of claim 1, wherein the kit is configured to retrofit a previously-produced UAV.

15. The kit of claim 1, wherein the kit is configured for upgrading a UAV during production.

16. The kit of claim 1, wherein the kit is configured to improve an endurance of the UAV by at least 50% as compared with an endurance of the UAV without the solar power source.

17. The kit of claim 1, wherein the kit is configured to increase an endurance of the UAV by at least 100% as compared with an endurance of the UAV without the solar power source.

18. The kit of claim 1, wherein the kit is configured to provide between 40% and 99% of the average power consumed by the UAV during use.

19. The kit of claim 1, wherein the kit is configured to provide between 50% and 99% of the average power consumed by the UAV during use.

20. The kit of claim 1, wherein the kit is configured for installation in a small UAV.

21. A kit for increasing endurance of a battery-powered unmanned aerial vehicle (UAV), the kit comprising:

a plurality of solar cells configured to be attached to a surface of a battery-powered UAV, wherein each of the plurality of solar cells has a specific power of 1000-3000 W/kg; and a power conditioning system configured to operate the plurality of solar cells within a desired power range and configured to provide power in the form of a voltage compatible with an electrical system of the UAV.

22. The kit of claim 21, wherein at least a portion of the surface is disposed on a wing of the UAV.

23. The kit of claim 21, wherein the power conditioning system includes a power conditioning circuit.

24. The kit of claim 23, wherein the power conditioning system further comprises an electrical connection system configured to connect the power conditioning circuit with the plurality of solar cells and to connect the power conditioning circuit with an electrical system of the UAV.

25. The kit of claim 21, wherein the power conditioning system is further configured to charge a battery of the UAV with power supplied by the plurality of solar cells.

26. The kit of claim 21, wherein each of the plurality of solar cells has a thickness of less than 70 microns.

27. The kit of claim 21, wherein each of the plurality of solar cells has a thickness of between 12 microns and 70 microns.

28. The kit of claim 21, wherein the plurality of solar cells is incorporated into at least one flexible solar sheet.

29. The kit of claim 28, wherein the at least one flexible solar sheet has a specific power of between about 100 W/kg and about 2500 W/kg.

30. The kit of claim 28, wherein the at least one flexible solar sheet has a specific power of between about 400 W/kg and about 1200 W/kg.

31. The kit of claim 21, wherein the plurality of solar cells comprises inverted metamorphic solar cells.

32. The kit of claim 21, wherein the plurality of solar cells comprises solar cells produced using an epitaxial lift-off process.

33. The kit of claim 21, wherein the plurality of solar cells comprises inverted metamorphic solar cells produced using an epitaxial lift-off process.

34. The kit of claim 21, wherein the surface of at least a portion of a battery-powered UAV is disposed at least partially on a fuselage of the UAV.

35. The kit of claim 21, wherein the kit is configured to retrofit a previously-produced UAV.

36. The kit of claim 21, wherein the kit is configured for upgrading a UAV during production.

37. The kit of claim 21, wherein the kit is configured to improve an endurance of the UAV by at least 50% as compared with an endurance of the UAV without the solar power source.

38. The kit of claim 21, wherein the kit is configured to increase an endurance of the UAV by at least 100% as compared with an endurance of the UAV without the solar power source.

39. The kit of claim 21, wherein the kit is configured to provide between 40% and 99% of the average power consumed by the UAV during use.

40. The kit of claim 21, wherein the kit is configured to provide between 50% and 99% of the average power consumed by the UAV during use.

41. The kit of claim 21, wherein the kit is configured for installation in a small UAV.

42. A method of increasing an endurance of a battery-powered unmanned aerial vehicle (UAV), the method comprising:

providing a component of a UAV, the component including a plurality of solar cells, wherein each of the plurality of solar cells has a specific power of 1000-3000 W/kg;

providing a power conditioning system configured to operate the plurality of solar cells within a desired power range and configured to provide power in the form of a voltage compatible with an electrical system of a UAV;

installing the component in a UAV; and connecting the power conditioning system with the electrical system of the UAV.

43. The method of claim 42, wherein the component is at least a portion of a wing.

44. The method of claim 42, wherein installing the component in the UAV comprising replacing a previously-produced component in a previously-produced UAV with the provided component.

45. The method of claim 42, wherein installing the component in the UAV occurs during manufacturing of the UAV.

46. A method of increasing an endurance of a battery-powered unmanned aerial vehicle (UAV), the method comprising:

attaching a plurality of solar cells to a surface of a battery-powered UAV, wherein each of the plurality of solar cells has a specific power of 1000-3000 W/kg;

providing a power conditioning system configured to operate the plurality of solar cells within a desired power range and configured to provide power in the form of a voltage compatible with an electrical system of the UAV; and connecting the power conditioning system with the electrical system of the UAV.

47. The method of claim 46, attaching a plurality of solar cells to a surface of at least a portion of a battery-powered UAV comprises attaching the plurality of solar cells to a surface of a wing of the UAV.

48. The method of claim 46, wherein attaching a plurality of solar cells to a surface of at least a portion of a battery-powered UAV comprises attaching the plurality of solar cells to a surface of at least a portion of a previously-produced battery-powered UAV.

49. The method of claim 46, wherein attaching a plurality of solar cells to a surface of at least a portion of a battery-powered UAV occurs during initial production of the battery-powered UAV.

* * * * *